(12) United States Patent
Lee et al.

(10) Patent No.: US 10,157,971 B2
(45) Date of Patent: Dec. 18, 2018

(54) ORGANIC LIGHT-EMITTING DIODE DISPLAY

(71) Applicant: Samsung Display Co., Ltd., Yongin-si (KR)

(72) Inventors: Dong Sun Lee, Cheonan-si (KR); Seon I Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/003,616

(22) Filed: Jun. 8, 2018

(65) Prior Publication Data

US 2018/0294325 A1 Oct. 11, 2018

Related U.S. Application Data

(62) Division of application No. 15/232,598, filed on Aug. 9, 2016, now Pat. No. 9,997,582.

(30) Foreign Application Priority Data

Aug. 11, 2015 (KR) ........................ 10-2015-0113266

(51) Int. Cl.
*G09G 3/30* (2006.01)
*H01L 27/32* (2006.01)
*G09G 3/3233* (2016.01)

(52) U.S. Cl.
CPC ....... *H01L 27/3265* (2013.01); *G09G 3/3233* (2013.01); *H01L 27/3276* (2013.01);
(Continued)

(58) Field of Classification Search
CPC .. G09G 3/3208; G09G 3/3225; G09G 3/3233; G09G 3/3258; G09G 2300/0426
(Continued)

(56) References Cited

U.S. PATENT DOCUMENTS 7,855,387 B2 12/2010 Kubota et al.
2009/0167659 A1 7/2009 Kim et al.
(Continued)

FOREIGN PATENT DOCUMENTS

KR 10-2009-0074458 7/2009
KR 10-2011-0037644 4/2011
(Continued)

OTHER PUBLICATIONS

Ex Parte Quayle Action issued Dec. 14, 2017, in U.S. Appl. No. 15/232,598.

(Continued)

*Primary Examiner* — Roy P Rabindranath
(74) *Attorney, Agent, or Firm* — H.C. Park & Associates, PLC

(57) ABSTRACT

An organic light-emitting diode (OLED) display includes a substrate, a scan line disposed over the substrate and configured to transmit a scan signal, a data line crossing the scan line and configured to transmit a data voltage a driving voltage line crossing the scan line and configured to transmit a driving voltage, a switching transistor connected to the scan line and the data line, a driving transistor connected to the switching transistor and including a driving gate electrode, a driving source electrode, and a driving drain electrode, and an OLED electrically connected to the driving transistor, wherein the driving source electrode at least partially overlaps the data line in the depth dimension of the OLED display so as to form an assistance capacitor.

15 Claims, 14 Drawing Sheets

(52) U.S. Cl.
CPC ........... *G09G 2300/0426* (2013.01); *G09G 2300/0819* (2013.01); *G09G 2300/0842* (2013.01); *G09G 2310/0245* (2013.01); *G09G 2320/045* (2013.01); *G09G 2320/066* (2013.01)

(58) Field of Classification Search
USPC .................................................. 345/76–77
See application file for complete search history.

(56) References Cited

U.S. PATENT DOCUMENTS

| | | |
|---|---|---|
| 2010/0149075 A1 | 6/2010 | Iida et al. |
| 2010/0182224 A1* | 7/2010 | Iida .................. G09G 3/3233 345/80 |
| 2011/0080395 A1 | 4/2011 | Chung |
| 2012/0162275 A1 | 6/2012 | Park |
| 2012/0249454 A1 | 10/2012 | Teraguchi et al. |
| 2014/0034923 A1 | 2/2014 | Kim et al. |
| 2014/0111557 A1 | 4/2014 | Omata et al. |

FOREIGN PATENT DOCUMENTS

| | | |
|---|---|---|
| KR | 10-2012-0075040 | 7/2012 |
| KR | 10-2014-0018623 | 2/2014 |

OTHER PUBLICATIONS

Notice of Allowance dated Mar. 15, 2018, in U.S. Appl. No. 15/232,598.

* cited by examiner

ORGANIC LIGHT-EMITTING DIODE DISPLAY

CROSS-REFERENCE TO RELATED APPLICATION

This application is a Divisional of U.S. patent application Ser. No. 15/232,598, filed on Aug. 9, 2016, which claims priority from and the benefit of Korean Patent Application No. 10-2015-0113266, filed on Aug. 11, 2015, each of which is hereby incorporated by reference for all purposes as if fully set forth herein.

BACKGROUND

Field

The described technology generally relates to an organic light-emitting diode display.

Discussion of the Background

An organic light-emitting diode (OLED) display includes two electrodes and an interposed organic emission layer positioned therebetween, wherein an electron injected from one electrode and a hole injected from the other electrode are coupled with each other in the organic emission layer to generate an exciton, and the exciton emits energy to emit light.

An OLED display includes multiple pixels each including an OLED which is self-emissive. In each pixel, multiple transistors for driving the OLED and at least one storage capacitor are formed. The transistors generally include a switching transistor and a driving transistor.

When the OLED display generates a scrolling screen or a motion picture, the process of a pixel display can include a black gray changing to a white gray. If it does not reach the desired luminance, the unintended result is a screen overlapping or dragging phenomenon. This phenomenon occurs due to a change of voltage of a source electrode caused by parasitic capacitance existing between the gate electrode and the source electrode of the driving transistor during initialization.

The above information disclosed in this Background section is only for enhancement of understanding of the background of the described technology and therefore it may contain information that does not form the prior art that is already known in this country to a person of ordinary skill in the art.

SUMMARY

One inventive aspect relates to an OLED display that can reduce the screen overlapping or dragging phenomenon.

Another aspect is an OLED display that includes: a substrate; a scan line disposed on the substrate and configured to transmit a scan signal; a data line crossing the scan line and configured to transmit a data voltage; a driving voltage line crossing a scan line and configured to transmit a driving voltage; a switching transistor connected to the scan line and the data line; a driving transistor connected to the switching transistor and including a driving gate electrode, a driving source electrode, and a driving drain electrode; and an OLED electrically connected to the driving transistor, wherein the driving source electrode overlaps the driving voltage line to form an assistance capacitor.

Capacitance of the assistance capacitor may be larger than capacitance of a parasitic capacitor formed between the driving gate electrode and the driving source electrode.

The width of a portion of the driving voltage line overlapping the driving source electrode may be larger than the width of a portion of the driving voltage line that does not overlap the driving source electrode in a plan view.

The switching transistor may include a switching gate electrode, a switching source electrode, and a switching drain electrode, the switching source electrode, the switching drain electrode, and the driving source electrode extend in a direction substantially parallel to the driving voltage line to be positioned on the same line, and the width of the driving source electrode may be larger than the width of the switching source electrode.

The driving voltage line may include a first driving voltage line substantially parallel to the data line and a second driving voltage line crossing the data line, and the driving source electrode may overlap the first driving voltage line.

The first driving voltage line may be disposed with the same layer as the data line, and the second driving voltage line may be disposed with the same layer as the scan s line.

The OLED may include: a pixel electrode electrically connected to the transistor; an organic emission layer formed on the pixel electrode; and a common electrode formed on the organic emission layer, and an initialization voltage line formed with the same layer as the pixel electrode and transmitting an initialization voltage initializing the driving transistor may be further included.

Another aspect is an OLED display that includes: a substrate; a scan line formed on the substrate and transmitting a scan signal; a data line crossing the scan line and transmitting a data voltage; a driving voltage line crossing the scan line and transmitting a driving voltage; a switching transistor connected to the scan line and the data line; a driving transistor connected to the switching transistor and including a driving gate electrode, a driving source electrode, and a driving drain electrode; and an OLED electrically connected to the driving transistor, wherein the driving source electrode overlaps the data line to form an assistance capacitor.

Capacitance of the assistance capacitor may be larger than capacitance of a parasitic capacitor formed between the driving gate electrode and the driving source electrode.

The width of the driving source electrode may be large than the width of the data line on a plane.

The OLED may include: a pixel electrode electrically connected to the driving transistor; an organic emission layer disposed on the pixel electrode; and a common electrode disposed on the organic emission layer, and an initialization voltage line disposed with the same layer as the pixel electrode and transmitting an initialization voltage initializing the driving transistor may be further included.

Another aspect is an organic light-emitting diode (OLED) display comprising: a substrate; a scan line disposed over the substrate and configured to transmit a scan signal; a data line crossing the scan line and configured to transmit a data voltage; a driving voltage line crossing the scan line and configured to transmit a driving voltage; a switching transistor connected to the scan line and the data line; a driving transistor connected to the switching transistor and including a driving gate electrode, a driving source electrode, and a driving drain electrode; and an OLED electrically connected to the driving transistor, wherein the driving source electrode at least partially overlaps the driving voltage line in the depth dimension of the OLED display so as to form an assistance capacitor.

The above OLED display further comprises a parasitic capacitor formed between the driving gate electrode and the driving source electrode, wherein the assistance capacitor has a capacitance that is larger than that of the parasitic capacitor.

In the above OLED display, the driving voltage line includes a first portion that overlaps the driving source electrode and a second portion that does not overlap the driving source electrode, wherein the width of the first portion is larger than the width of the second portion in a plan view.

In the above OLED display, the switching transistor includes a switching gate electrode, a switching source electrode, and a switching drain electrode, wherein the switching source electrode, the switching drain electrode, and the driving source electrode extend in a direction parallel to the driving voltage line to be positioned on the same line and wherein the width of the driving source electrode is larger than the width of the switching source electrode.

In the above OLED display, the driving voltage line includes a first driving voltage line parallel to the data line and a second driving voltage line crossing the data line, wherein the driving source electrode overlaps the first driving voltage line in the depth dimension of the OLED display.

In the above OLED display, the first driving voltage line is disposed on the same layer as the data line, wherein the second driving voltage line is disposed on the same layer as the scan line.

In the above OLED display, the OLED includes: a pixel electrode electrically connected to the driving transistor; an organic emission layer disposed on the pixel electrode; and a common electrode disposed on the organic emission layer, wherein the OLED display further comprises an initialization voltage line disposed on the same layer as the pixel electrode and configured to transmit an initialization voltage initializing the driving transistor.

The above OLED display further comprises: a first insulating layer formed on the driving source electrode; a first storage capacitor electrode formed on the first insulating layer; a second insulating layer formed on the first storage capacitor electrode; and a second storage capacitor electrode formed on the second insulating layer.

In the above OLED display, the driving source electrode overlaps the second storage capacitor electrode and does not overlap the first storage capacitor electrode in the depth dimension of the OLED display.

In the above OLED display, the driving source electrode has a width smaller than that of each of the first and second capacitor electrodes.

The above OLED display further comprises an initialization voltage line configured to transfers an initialization voltage for the driving transistor, wherein the driving source electrode overlaps the initialization voltage line in the depth dimension of the OLED display.

In the above OLED display, the driving source electrode has a width larger than that of the initialization voltage line Another aspect is an organic light-emitting diode (OLED) display, comprising: a substrate; a scan line disposed over the substrate and configured to transmit a scan signal; a data line crossing the scan line and configured to transmit a data voltage; a driving voltage line crossing the scan line and configured to transmit a driving voltage; a switching transistor connected to the scan line and the data line; a driving transistor connected to the switching transistor and including a driving gate electrode, a driving source electrode, and a driving drain electrode; and an OLED electrically connected to the driving transistor, wherein the driving source electrode at least partially overlaps the data line in the depth dimension of the OLED display so as to form an assistance capacitor.

The above OLED display further comprises a parasitic capacitor formed between the driving gate electrode and the driving source electrode, wherein the assistance capacitor has a capacitance that is larger than that of the parasitic capacitor.

In the above OLED display, the driving source electrode has a width that is larger than that of the data line in a plan view.

In the above OLED display, the OLED includes: a pixel electrode electrically connected to the driving transistor; an organic emission layer disposed on the pixel electrode; and a common electrode disposed on the organic emission layer, wherein the OLED display further comprises an initialization voltage line formed on the same layer as the pixel electrode and configured to transmit an initialization voltage initializing the driving transistor.

In the above OLED display, the data line includes a first portion that overlaps the driving source electrode and a second portion that does not overlap the driving source electrode, and wherein the width of the first portion is larger than the width of the second portion in a plan view.

Another aspect is an organic light-emitting diode (OLED) display comprising: a driving voltage line configured to transmit a driving voltage; a driving transistor including a driving gate electrode, a driving source electrode, and a driving drain electrode; and an OLED electrically connected to the driving transistor, wherein the driving source electrode at least partially overlaps the driving voltage line in the depth dimension of the OLED display so as to form an assistance capacitor.

The above OLED display further comprises: a first insulating layer formed on the driving source electrode; a first storage capacitor electrode formed on the first insulating layer; a second insulating layer formed on the first storage capacitor electrode; and a second storage capacitor electrode formed on the second insulating layer.

In the above OLED display, the driving source electrode overlaps the second storage capacitor electrode and does not overlap the first storage capacitor electrode in the depth dimension of the OLED display.

At least one of the disclosed embodiments can prevent the voltage change of the source electrode due to the parasitic capacitance of the driving transistor, thereby improving the screen overlapping or dragging phenomenon.

DETAILED DESCRIPTION

Figure 1:
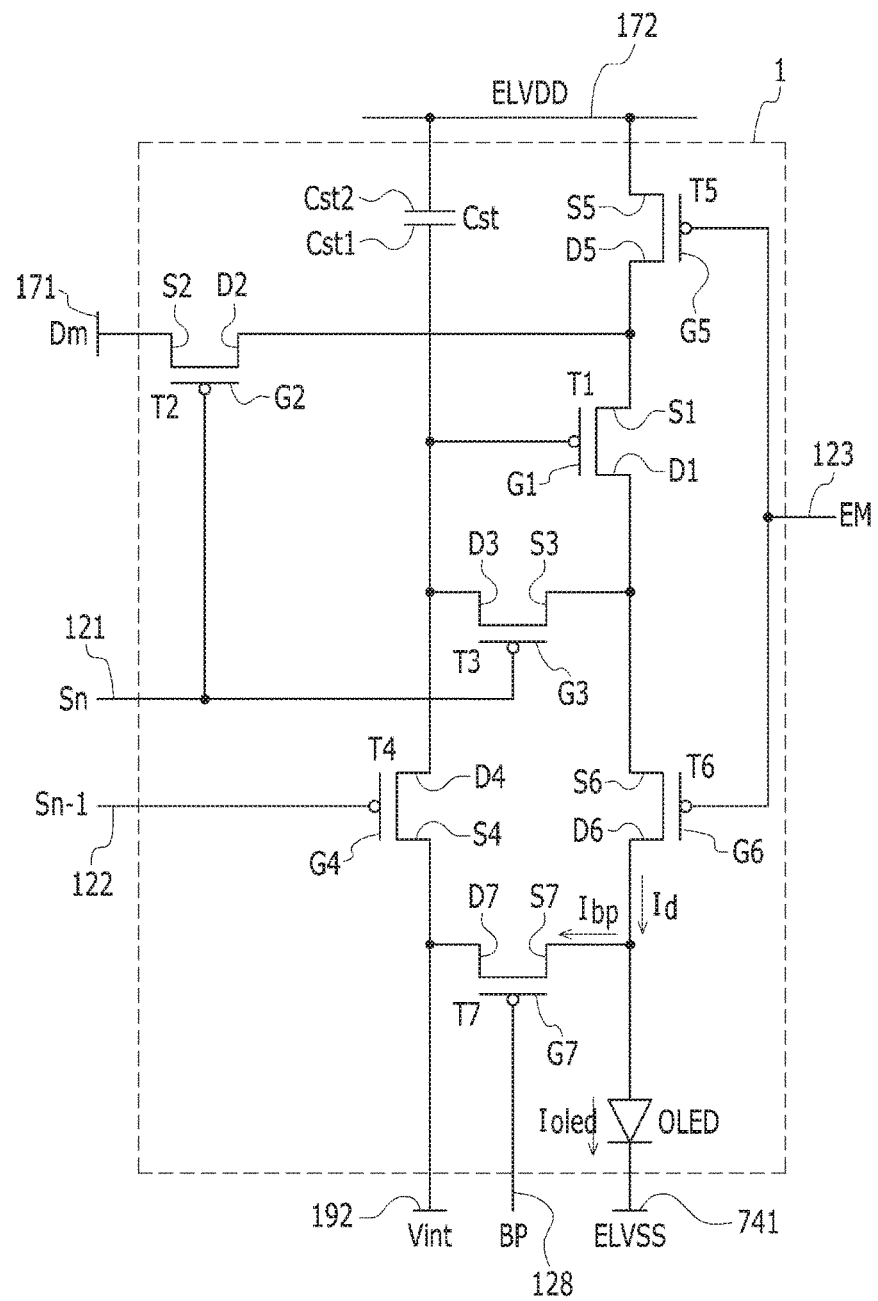
FIG. 1 is an equivalent circuit diagram of one pixel of an OLED display according to an exemplary embodiment.

Embodiments will be described more fully hereinafter with reference to the accompanying drawings. As those skilled in the art would realize, the described embodiments may be modified in various different ways, all without departing from the spirit or scope of the present invention.

Like reference numbers designate like constituent elements through the specification and drawings.

In addition, the size and thickness of each configuration shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present.

Further, in the specification, the phrase "in a plan view" means when an object portion is viewed from above, and the phrase "in a cross-section" means when a cross-section taken by vertically cutting an object portion is viewed from the side.

Further, in the accompany drawings, the present invention is not limited to the shown number of thin film transistors (TFTs) and capacitors, the OLED display may include a plurality of thin film transistors and one or more capacitors in one pixel, and may be formed to have various structures in which separate wiring is further formed or existing wiring is omitted. Here, the pixel is a minimum unit for displaying an image, and the OLED display displays an image through a plurality of pixels. In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Next, an OLED display according to an exemplary embodiment will be described with reference to FIG. 1 to FIG. 8.

FIG. 1 is an equivalent circuit diagram of one pixel 1 of an OLED display according to an exemplary embodiment.

As illustrated in FIG. 1, one pixel 1 of the OLED display according to the exemplary embodiment includes a plurality of signal lines 121, 122, 123, 128, 171, 172, and 192 (hereinafter "121-192"), a plurality of transistors T1, T2, T3, T4, T5, T6, and T7 which are connected to the signal lines 121-192, a storage capacitor Cst, and an OLED.

The transistors T1-T7 include a driving transistor T1, a switching transistor T2, a compensation transistor T3, an initialization transistor T4, an operation control transistor T5, a light emission control transistor T6, and a bypass transistor T7.

The signal lines 121-192 include a scan line 121 which transfers a scan signal Sn, a previous scan line 122 which transfers a previous scan signal S(n−1) to the initialization transistor T4, a light emission control line 123 which transfers a light emission control signal EM to the operation control transistor T5 and the light emission control transistor T6, a bypass control line 128 which transfers a bypass signal BP to the bypass transistor T7, a data line 171 which intersects the scan line 151 and transfers a data signal Dm, a driving voltage line 172 which transfers a driving voltage ELVDD and is formed in substantially parallel with the data line 171, and an initialization voltage line 192 which transfers an initialization voltage Vint initializing the driving transistor T1.

A gate electrode G1 of the driving transistor T1 is connected to one terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the OLED via the light emission control transistor T6. The driving transistor T1 receives the data signal Dm depending on a switching operation of the switching transistor T2 to supply a driving current Id to the OLED.

A gate electrode G2 of the switching transistor T2 is connected to the scan line 121, a source electrode S2 of the switching transistor T2 is connected to the data line 171, and a drain electrode D2 of the switching transistor T2 is connected to the driving voltage line 172 via the operation control transistor T5 while being connected to the source electrode S1 of the driving transistor T1. The switching transistor T2 is turned on depending on the scan signal Sn which is transferred through the scan line 121 to perform a switching operation of transferring the data signal Dm transferred through the data line 171 to the source electrode S1 of the driving transistor T1.

A gate electrode G3 of the compensation transistor T3 is connected to the scan line 121, a source electrode S3 of the compensation transistor T3 is connected to the anode of the OLED via the light emission control transistor T6 while being connected to the drain electrode D1 of the driving transistor T1, and a drain electrode D3 of the compensation transistor T3 is connected to a drain electrode D4 of the initialization transistor T4, one terminal Cst1 of the storage capacitor Cst, and the gate electrode G1 of the driving transistor T1 together. The compensation transistor T3 is turned on depending on the scan signal Sn which is transferred through the scan line 121 to connect between the gate electrode G1 and the drain electrode D1 of the driving transistor T1 so as to diode-connect the driving transistor T1.

A gate electrode G4 of the initialization transistor T4 is connected to the previous scan line 152, the source electrode S4 of the initialization transistor T4 is connected to the initialization voltage line 192, and the drain electrode D4 of the initialization transistor T4 is connected to one terminal Cst1 of the storage capacitor Cst via the drain electrode D3 of the compensation transistor T3 and the gate electrode G1 of the driving transistor T1 together. The initialization transistor T4 is turned on depending on the previous scan signal S(n−1) which is transferred through the previous scan line 122 to transfer the initialization voltage Vint to the gate electrode G1 of the driving transistor T1 so as to perform the initialization operation which initializes a gate voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the OLED. The operation control transistor T5 and the light emission control transistor T6 are simultaneously or concurrently turned on depending on the light emission control signal EM which is transferred through the light emission control line 123 and thus the driving voltage ELVDD is compensated by the diode-connected driving transistor T1 and then is transferred to the OLED.

A gate electrode G7 of the bypass transistor T7 is connected to the bypass control line 128, a source electrode S7 of the bypass transistor T7 is connected to the drain electrode D6 of the light emission control transistor T6 and the anode of the OLED together, and a drain electrode D7 of the bypass transistor T7 is connected to the initialization voltage line 192 and the source electrode S4 of the initialization transistor T4 together.

The other end Cst2 of the storage capacitor Cst is connected to the driving voltage line 172, and a cathode of the OLED is connected to a common voltage line 741 transferring a common voltage ELVSS.

Hereinafter, a detailed operation process of the pixel 1 will be described in detail with reference to FIG. 2.

Figure 2:
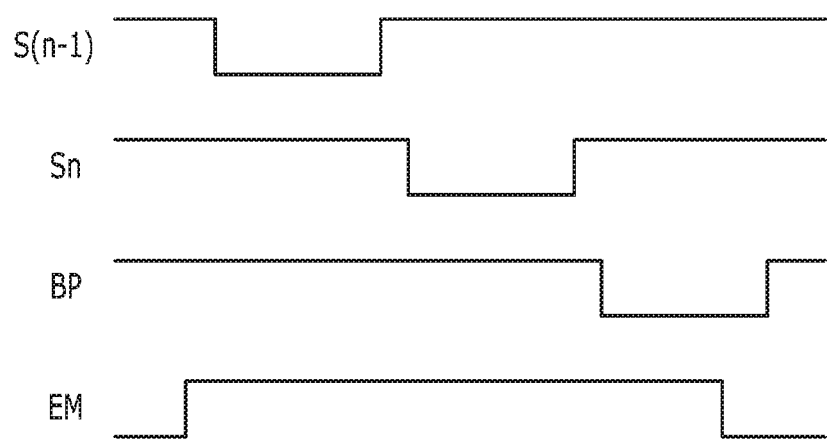
FIG. 2 is a timing diagram of a signal applied to one pixel of the OLED display according to the exemplary embodiment.

FIG. 2 is a timing diagram of a signal applied to one pixel of the OLED display according to the exemplary embodiment.

As illustrated in FIG. 2, the previous scan signal S(n−1) at a low level is firstly supplied through the previous scan line 122 for an initialization period. In this case, the light emission control signal EM at a low level is already applied through the light emission control line 123. Then, the initialization transistor T4 is turned on in response to the previous scan signal S(n−1) at the low level, the initialization voltage Vint is connected from the initialization voltage line 192 to the gate electrode of the driving transistor T1 through the initialization transistor T4, and the driving transistor T1 is initialized by the initialization voltage Vint.

Thereafter, the scan signal Sn having the low level is supplied through the scan line 121 during a data programming period. Then, the switching transistor T2 and the compensation transistor T3 are turned on in response to the scan signal Sn at the low level. In this case, the driving transistor T1 is diode-connected by the turned-on compensation transistor T3 and biased in a forward direction.

A compensation voltage Dm+Vth (Vth has a negative (−) value) reduced from the data signal Dm supplied from the data line 171 by a threshold voltage Vth of the driving transistor T1 is then applied to the gate electrode G1 of the driving transistor T1. The driving voltage ELVDD and the compensation voltage Dm+Vth are applied to both ends of the storage capacitor Cst, and a charge corresponding to a voltage difference between both ends is stored in the storage capacitor Cst.

Thereafter, for the emission period, the light emission control signal EM supplied from the light emission control line 123 is changed from the high level to the low level. Subsequently, for the emission period, the operation control transistor T5 and the light emission control transistor T6 are turned on by the light emission control signal EM at the low level.

Then, a driving current Id is generated according to a voltage difference between the gate voltage of the gate electrode G1 of the driving transistor T1 and the driving voltage ELVDD, and the driving current Id is supplied to the OLED through the light emission control transistor T6. For a light emission period, a gate-source voltage Vgs of the driving transistor T1 is maintained at '(Dm+Vth)-ELVDD' by the storage capacitor Cst, and according to a current-voltage relationship of the driving transistor T1, the driving current Id is proportional to the square '(Dm-ELVDD)2' of a value obtained by subtracting the threshold voltage from the source-gate voltage. Accordingly, the driving current Id is determined regardless of the threshold voltage Vth of the driving transistor T1.

In this case, the bypass transistor T7 receives the bypass signal BP from the bypass control line 128. The bypass signal BP is a voltage at a predetermined level which may always turn off the bypass transistor T7, the bypass transistor T7 receives a voltage at a transistor-off level from the gate electrode G7 and thus the bypass transistor T7 is always turned off, and a part of the driving current Id flows out through the bypass transistor T7 as a bypass current Ibp in the off state.

Even in the case where a minimum current of the driving transistor T1 displaying a black image flows as the driving current, when the OLED emits light, the black image is not displayed well. Accordingly, the bypass transistor T7 of the OLED display may distribute a part of the minimum current of the driving transistor T1 as the bypass current Ibp to a current path other than the current path of the OLED side. Herein, the minimum current of the driving transistor T1 means a current under a condition in which the driving transistor T1 is turned off because the gate-source voltage Vgs of the driving transistor T1 is smaller than the threshold voltage Vth. The minimum driving current (for example, a current of 10 pA or less) under the condition in which the driving transistor T1 is turned off is transferred to the OLED to be expressed as an image with black luminance. When the minimum driving current expressing the black image flows, an influence on a bypass transfer of the bypass current Ibp is large, but when a large driving current expressing an image such as a normal image or a white image flows, there may be little influence on the bypass current Ibp. Accordingly, when the driving current displaying a black image flows, the light emission current holed of the OLED which is reduced by the current amount of the bypass current Ibp which flows out from the driving current ld through the bypass transistor T7 has a minimum current amount as a level which may exactly express the black image. Therefore, a black luminance image is exactly implemented by using the bypass transistor T7, thereby improving a contrast ratio. In FIG. 2, the bypass signal BP is illustrated to be the same as a next scan signal S(n+1), but is not necessarily limited thereto. In the present exemplary embodiment, the structure including 7 transistors and 1 capacitor including the bypass transistor T7 is illustrated. However, the numbers of transistors and capacitors may be varied without being limited thereto.

Next, the detailed structure of the pixel of the OLED display shown in FIG. 1 will be described with reference to FIG. 3 to FIG. 7 as well as FIG. 1.

Figure 3:
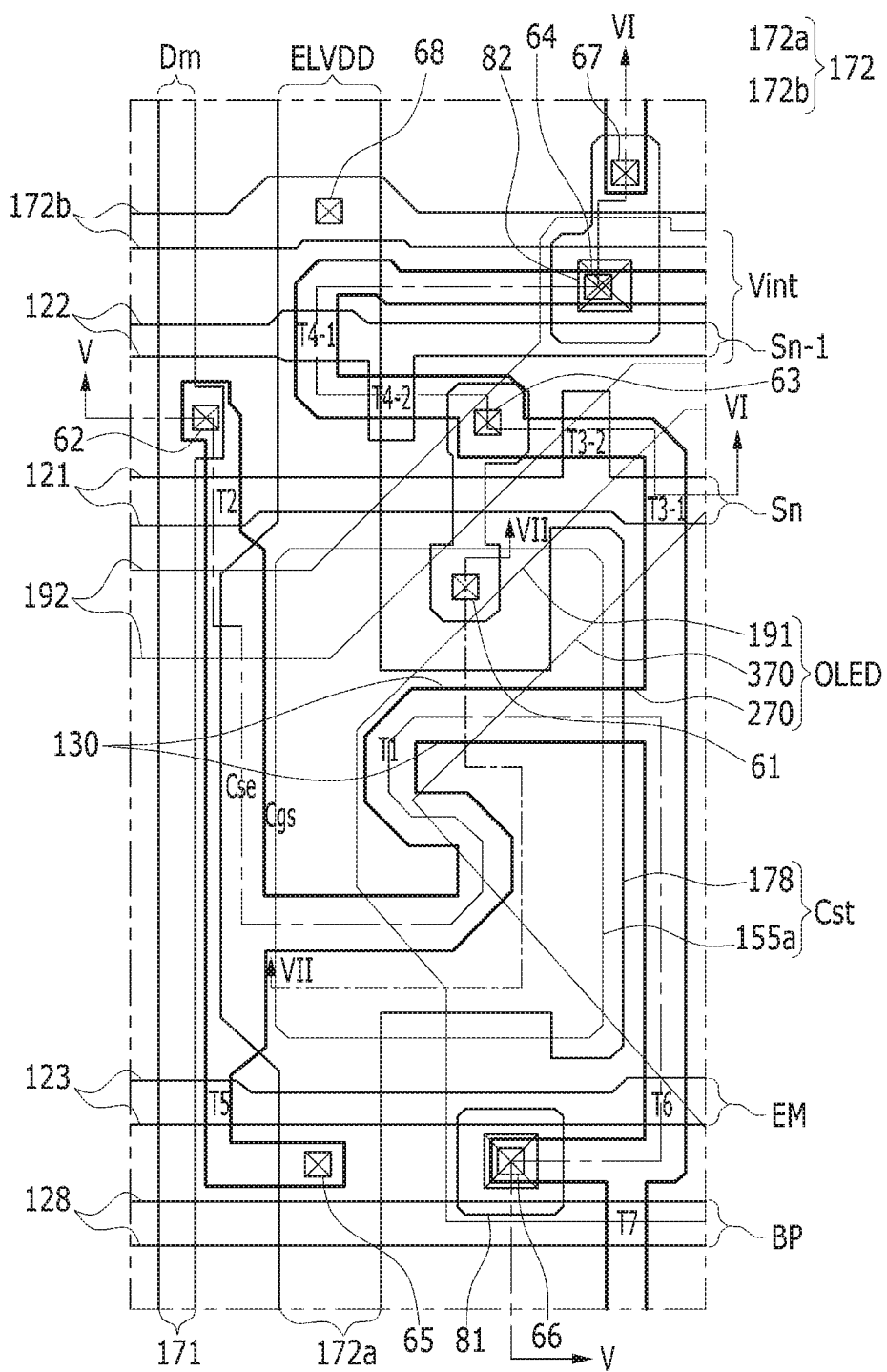
FIG. 3 is a diagram schematically illustrating a plurality of transistors and capacitors of an OLED display according to the exemplary embodiment.
Figure 4:
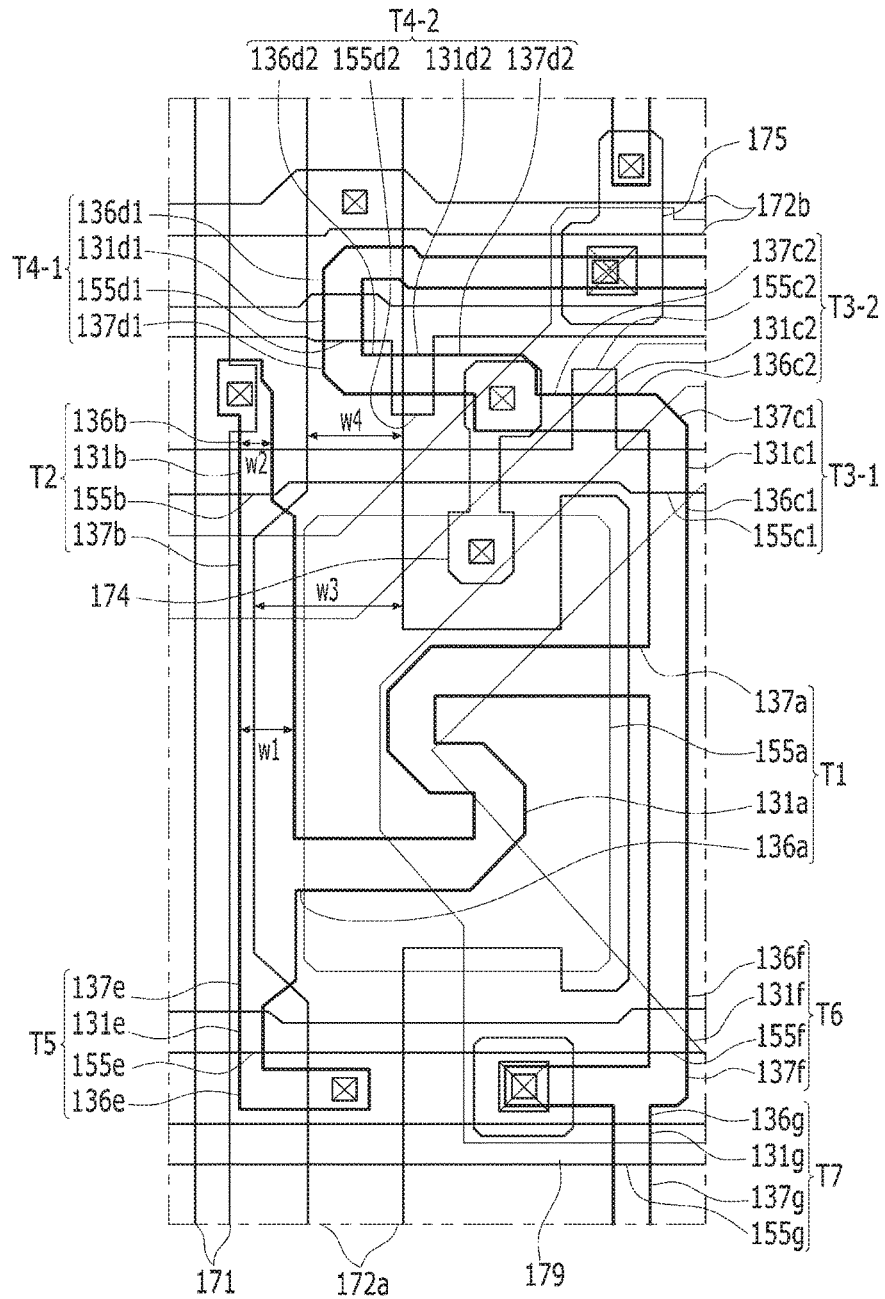
FIG. 4 is a detailed layout view of FIG. 3.
Figure 5:
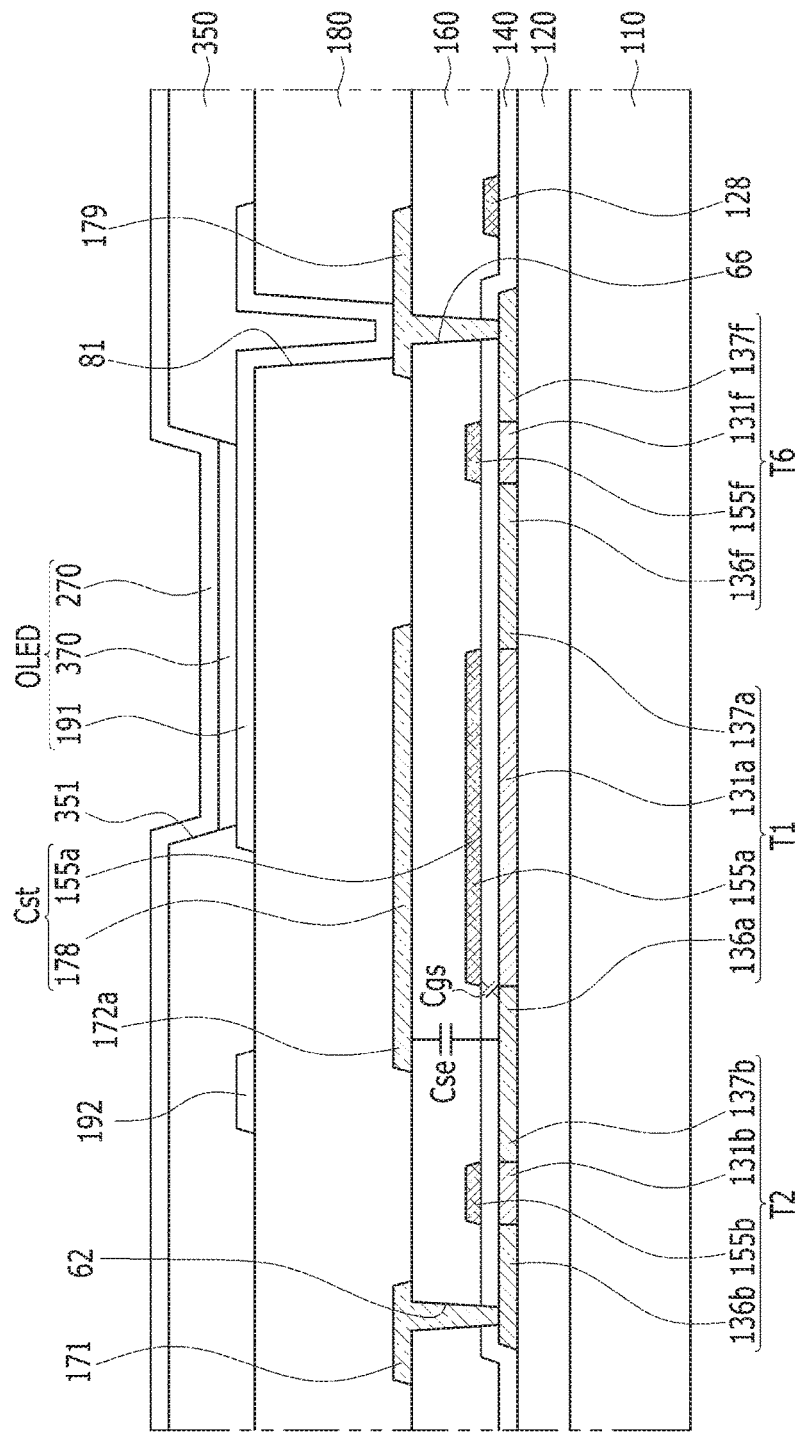
FIG. 5 is a cross-sectional view taken along line V-V of the OLED display of FIG. 3.
Figure 6:
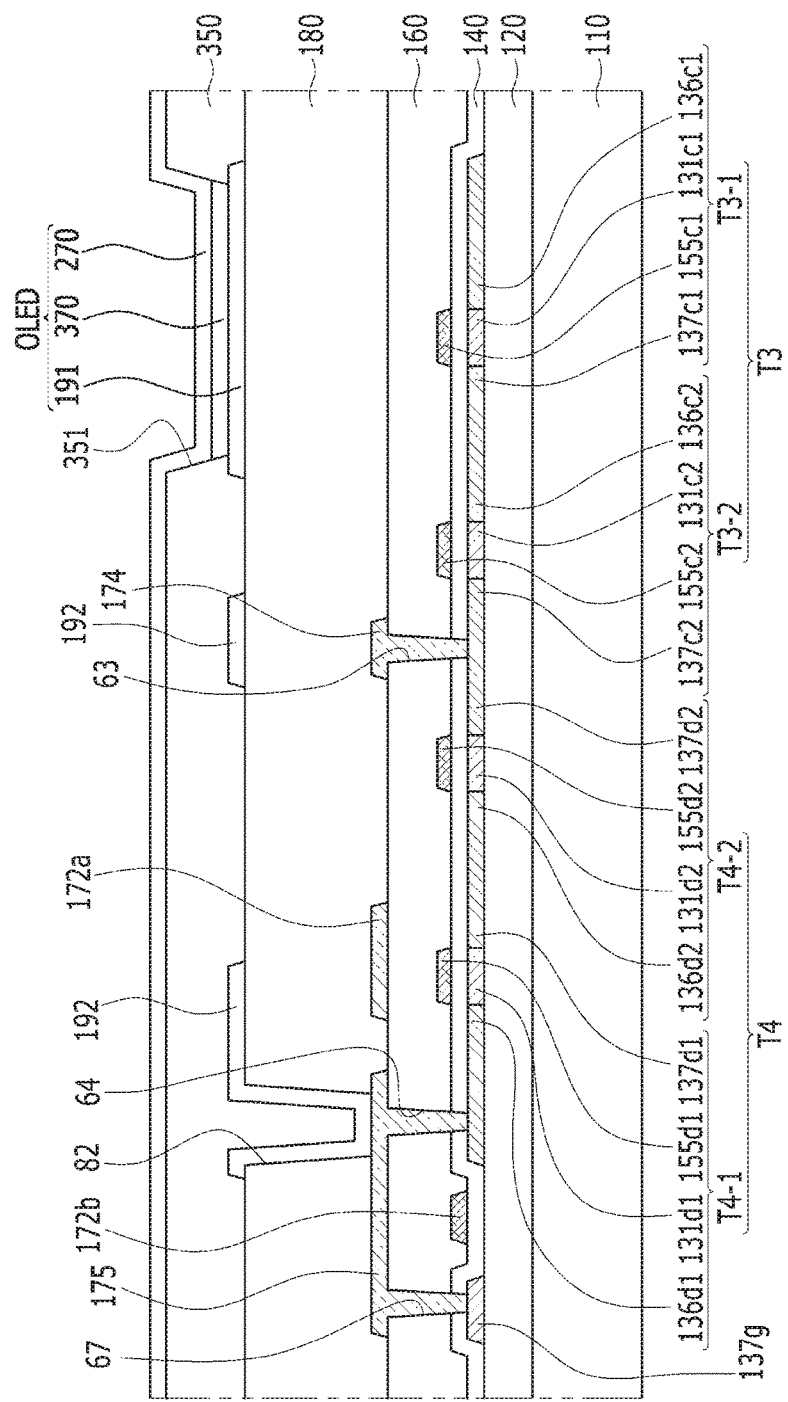
FIG. 6 is a cross-sectional view taken along line VI-VI of the OLED display of FIG. 3.
Figure 7:
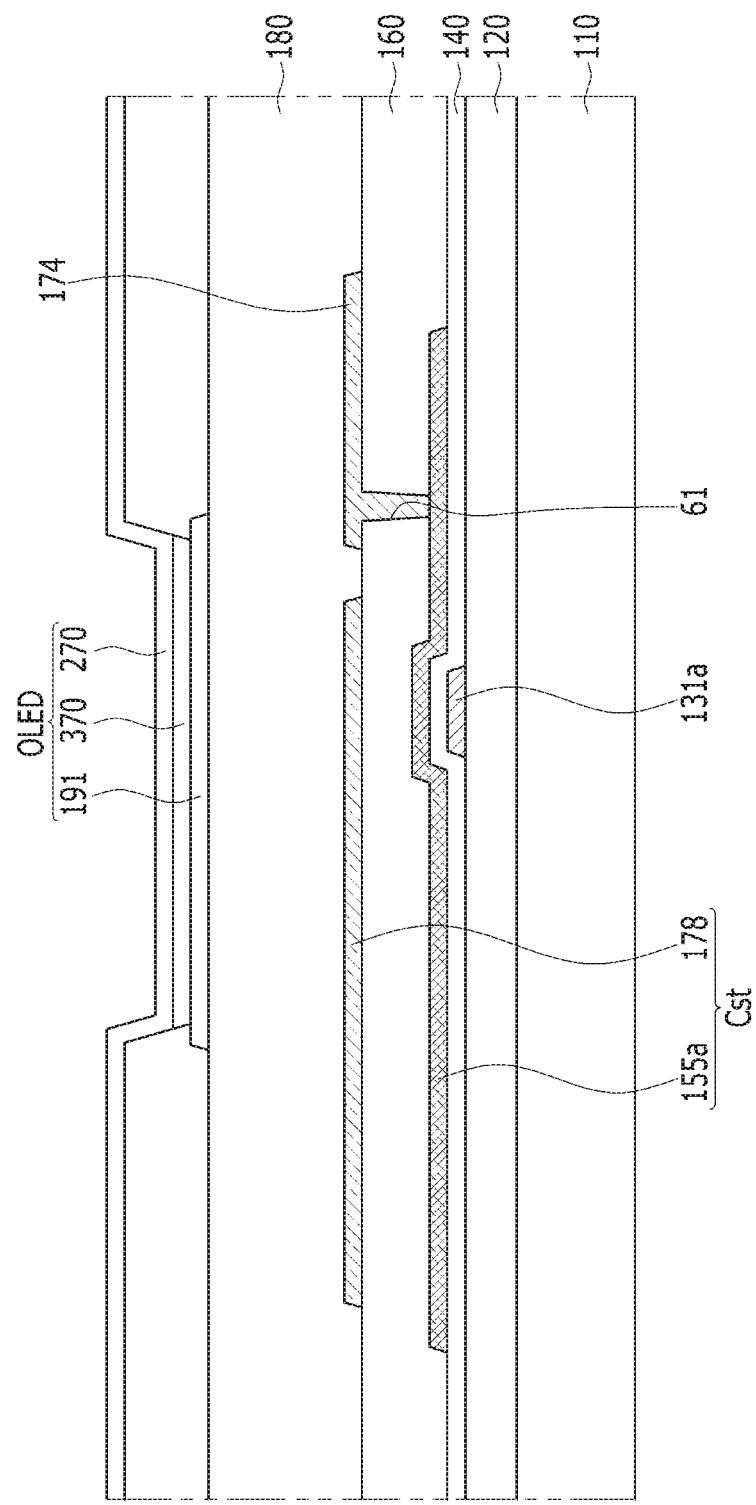
FIG. 7 is a cross-sectional view taken along line VI-VI of the OLED display of FIG. 3.

FIG. 3 is a diagram schematically illustrating a plurality of transistors and capacitors of an OLED display according to the exemplary embodiment, FIG. 4 is a detailed layout view of FIG. 3, FIG. 5 is a cross-sectional view taken along line V-V of the OLED display of FIG. 3, FIG. 6 is a cross-sectional view taken along line VI-VI of the OLED display of FIG. 3, and FIG. 7 is a cross-sectional view taken along line VI-VI of the OLED display of FIG. 3.

Hereinafter, a detailed planar structure of the OLED display according to the exemplary embodiment will be first described in detail with reference to FIG. 3 and FIG. 4, and a detailed cross-sectional structure will be described in detail with reference to FIG. 5 to FIG. 7.

First, as shown in FIG. 3, the OLED display includes the scan line 121, the previous scan line 122, the light emission control line 123, and the bypass control line 128 respectively applying the scan signal Sn, the previous scan signal S(n−1), the light emission control signal EM, and the bypass signal BP and formed along with the row direction, and includes the data line 171 and the driving voltage line 172 respectively applying the data signal Dm and the driving voltage ELVDD to the pixel. The data line 171 may cross the scan line 121, the previous scan line 122, the light emission control line 123, and the bypass control line 128. The initialization voltage Vint is transmitted to the compensation transistor T3 through the initialization voltage line 192. The driving voltage line 172 includes a first driving voltage line 172a substantially parallel to the data line 171 and a second driving voltage line 172b substantially parallel to the scan line 121. The first driving voltage line 172a and the second driving voltage line 172b are electrically connected to each other.

Also, in the pixel, the driving transistor T1, the switching transistor T2, the compensation transistor T3, the initialization transistor T4, the operation control transistor T5, the light emission control transistor T6, the bypass transistor T7, the storage capacitor Cst, and the OLED including a pixel electrode 191, an organic emission layer 370, and a common electrode 270 are formed. In this case, the compensation transistor T3 and the initialization transistor T4 are configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 are formed in one semiconductor 130 to be connected, and the semiconductor 130 may be formed to be curved in various shapes. The semiconductor 130 may be made of a polycrystalline semiconductor material or an oxide semiconductor material. The oxide semiconductor material may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (In—Zn—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is made of the oxide semiconductor material, a separate passivation layer for protecting the oxide semiconductor material which is vulnerable to an external environment such as a high temperature may be added.

The semiconductor 130 includes a channel which is channel-doped with an N-type impurity or a P-type impurity, and a source doping part and a drain doping part which are formed at respective sides of the channel and doped with an opposite-type doping impurity to the doping impurity doped on the channel. In the present exemplary embodiment, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped and thus the source electrode and the drain electrode may be electrically connected to each other.

As illustrated in FIG. 4, the channel includes a driving channel 131a formed in the drive transistor T1, a switching channel formed in the switching transistor T2, first and second compensation channels 131c1 and 131c2 formed in the compensation transistor T3, first and second initialization channels 131d1 and 131d2 formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed to be elongated in a narrow space. Accordingly, a driving range of the gate voltage applied to the driving gate electrode 155a is increased by the elongated driving channel 131a. Since the driving range of the gate voltage is increased, a gray scale of light emitted from the OLED may be finely controlled by changing the magnitude of the gate voltage, and as a result, the resolution of the OLED display device may be enhanced and display quality may be improved. Various examples such as 'reverse S', 'S', 'M', and 'W' may be implemented by variously modifying the shape of the driving channel 131a.

The driving gate electrode 155a is overlapped with the driving channel 131a, and the driving source electrode 136a and the driving drain electrode 137a do not overlap the driving channel 131a.

The driving source electrode 136a overlaps the driving voltage line 172. Particularly, the driving source electrode 136a overlaps the first driving voltage line 172a. By overlapping the driving source electrode 136a and the driving voltage line 172, an assistance capacitor Cse is formed. That is, one end of the assistance capacitor Cse is a part of the driving source electrode 136a, and the other end of the assistance capacitor Cse is a part of the driving voltage line 172. In this case, the capacitance of the assistance capacitor Cse is determined by the overlapping area of the driving source electrode 136a and the driving voltage line 172.

A parasitic capacitor Cgs is formed between the driving gate electrode 155a and the driving source electrode 136a. In this case, the capacitance of the parasitic capacitor Cgs is determined by a distance between the driving gate electrode 155a and the driving source electrode 136a.

The capacitance of the assistance capacitor Cse can be larger than the capacitance of the parasitic capacitor Cgs.

The switching transistor T2 includes the switching channel 131b, a switching gate electrode 155b, a switching source electrode 136b, and a switching drain electrode 137b. The switching gate electrode 155b which is a part extended downward from the scan line 121 overlaps the switching channel 131b, and the switching source electrode 136b and the switching drain electrode 137b do not overlap the switching channel 131b. The switching source electrode 136b is connected to the data line 171 through a contact hole 62.

The switching source electrode 136b, the switching drain electrode 137b, and the driving source electrode 136a extends in a direction substantially parallel to the first driving voltage line 172a on the plane to be positioned on the same line. In this case, the width w1 of the driving source electrode 136a is larger than the width w2 of the switching source electrode 136b.

Also, the width w3 of the portion of the first driving voltage line 172a overlapping the driving source electrode 136a on the plane is larger than the width w4 of the portion of the first driving voltage line 172a that does not overlap the driving source electrode 136a.

In this way, the width of the driving source electrode 136a and the first driving voltage line 172a may be designed to maximize the overlapping area of the driving source electrode 136a and the first driving voltage line 172a.

The compensation transistor T3 is formed to include two compensation transistors in order to prevent the leakage current, and specifically includes a first compensation transistor T3-1 and a second compensation transistor T3-2 which are adjacent each other. The first compensation transistor T3-1 is disposed around the scan line 121, and the second compensation transistor T3-2 is positioned around a projection of the scan line 121. The first compensation transistor T3-1 includes the first compensation channel 131c1, a first compensation gate electrode 155c1, a first compensation source electrode 136c1, and a first compensation drain electrode 137c1, and the second compensation transistor T3-2 includes the second compensation channel 131c2, a second compensation gate electrode 155c2, a second compensation source electrode 136c2, and a second compensation drain electrode 137c2.

The first compensation gate electrode 155c1 which is a part of the scan line 121 overlaps the first compensation channel 131c1, and the first compensation source electrode 136c1 and the first compensation drain electrode 137c1 do not overlap the first compensation channel 131c1. The first compensation source electrode 136c1 is connected to a light emission control source electrode 136f and the driving drain electrode 137a, and the first compensation drain electrode 137c1 is connected to the second compensation source electrode 136c2.

The second compensation gate electrode 155c2 which is a projection protruding upward from the scan line 121 overlaps the second compensation channel 131c2, and the second compensation source electrode 136c2 and the second compensation drain electrode 137c2 do not overlap the second compensation channel 131c2. The second compensation drain electrode 137c2 is connected to a first data connection member 174 through a contact hole 63.

The initialization transistor T4 is formed to include two initialization transistors in order to prevent the leakage current, and specifically includes a first initialization transistor T4-1 and a second initialization transistor T4-2 which are adjacent to each other. The first initialization transistor T4-1 is disposed around the previous scan line 122, and the second initialization transistor T4-2 is disposed around a projection of the previous scan line 122. The first initialization transistor T4-1 includes the first initialization channel 131d1, a first initialization gate electrode 155d1, a first initialization source electrode 136d1, and a first initialization drain electrode 137d1, and the second initialization transistor T4-2 includes the second initialization channel 131d2, a second initialization gate electrode 155d2, a second initialization source electrode 136d2, and a second initialization drain electrode 137d2.

The first initialization gate electrode 155d1 which is a part of the previous scan line 122 overlaps the first initialization channel 131d1, and the first initialization source electrode 136d1 and the first initialization drain electrode 137d1 do not overlap the first initialization channel 131d1. The first initialization source electrode 136d1 is connected to a second data connection member 175 through a contact hole 64, and the first initialization drain electrode 137d1 is connected to the second initialization source electrode 136d2.

The second initialization gate electrode 155d2 which is a projection protruding downward from the previous scan line 122 overlaps with the second initialization channel 131d2, and the second initialization source electrode 136d2 and the second initialization drain electrode 137d2 do not overlap with the second initialization channel 131c2. The second initialization drain electrode 137d2 is connected to the first data connection member 174 through the contact hole 63.

As such, the compensation transistor T3 includes the first compensation transistor T3-1 and the second compensation transistor T3-2, and the initialization transistor T4 includes the first initialization transistor T4-1 and the second initialization transistor T4-2, and as a result, it is possible to efficiently prevent the leakage current from being generated by blocking an electron moving path of the semiconductor 130 in the off state.

The operation control transistor T5 includes the operation control channel 131e, an operation control gate electrode 155e, an operation control source electrode 136e, and an operation control drain electrode 137e. The operation control gate electrode 155e which is a part of the light emission control line 123 overlaps the operation control channel 131e, and does not overlap the operation control source electrode 136e and the operation control drain electrode 137e. The operation control source electrode 136e is connected to a part of the driving voltage line 172 through a contact hole 65.

The light emission control transistor T6 includes the light emission control channel 131f, a light emission control gate electrode 155f, the light emission control source electrode 136f, and a light emission control drain electrode 137f. The light emission control gate electrode 155f which is a part of the light emission control line 123 overlaps the light emission control channel 131f, and does not overlap the light emission control source electrode 136f and the light emission control drain electrode 137f The light emission control drain electrode 137f is connected to a third data connection member 179 through a contact hole 66.

The bypass transistor T7 includes the bypass channel 131g, a bypass gate electrode 155g, a bypass source electrode 136g, and a bypass drain electrode 137g. The bypass gate electrode 155g which is a part of the bypass control line 128 overlaps the bypass channel 131g, and does not overlap the bypass source electrode 136g and the bypass drain electrode 137g. The bypass source electrode 136g is directly connected to the light emission control drain electrode 137f, and the bypass drain electrode 137g is connected to a second data connection member 175 through a contact hole 82.

One end of the driving channel 131a of the driving transistor T1 is connected to the switching drain electrode 137b and the operation control drain electrode 137e, and the other end of the driving channel 131a is connected to the compensation source electrode 136c and the light emission control source electrode 136f.

The storage capacitor Cst includes a first storage electrode 155a and a second storage electrode 178 disposed via a second insulating layer 160 interposed therebetween. The first storage electrode 155a corresponds to the driving gate electrode 155a, and the second storage electrode 178 is an expanding region of the first driving voltage line 172a and is formed one by one for each pixel. Here, the second insulating layer 160 becomes a dielectric material, and a storage capacitance is determined by a charge charged to the storage capacitor Cst and a voltage between the electrodes 155a and 178. As described above, by using the driving gate electrode 155a as the first storage electrode 155a, a space for forming the storage capacitor may be obtained in the space that is decreased by the driving channel 131a occupying a large area in the pixel.

The first storage electrode 155a as the driving gate electrode 155a is connected to the first data connecting member 174 through a contact hole 61. The first data connection member 174 is formed on the same layer as the data line 171 to be substantially parallel thereto, and serves to connect the driving gate electrode 155a, the second compensation drain electrode 137c2 of the second compensation transistor T3-2, and the second initialization drain electrode 137d2 of the second initialization transistor T4-2.

Accordingly, the storage capacitor Cst stores the storage capacitance corresponding to the driving voltage ELVDD transmitted to the second storage electrode 178 through the first driving voltage line 172a and the gate voltage of the driving gate electrode 155a.

Hereinafter, cross-sectional structures of the OLED display according to an exemplary embodiment will be described in detail according to a stacking order with reference to FIG. 5 to FIG. 7.

In this case, since stacked structures of the operation control transistor T5 are mostly the same as that of the light emission control transistor T6, a detailed description thereof will be omitted.

A buffer layer 120 may be formed on an insulating substrate 110. The insulating substrate 110 may be formed of an insulating material such as glass, crystal, ceramic, or plastic, and the buffer layer 120 blocks impurities from the insulating substrate 110 during a crystallization process for forming a polycrystalline semiconductor to serve to improve characteristics of the polycrystalline semiconductor and reduce stress applied to the insulating substrate 110.

On the buffer layer 120 of the pixel unit P, a semiconductor 130 is formed, which includes a driving channel 131a, a switching channel 131b, a compensation channel 131c, an initialization channel 131d, an operation control channel 131e, and a light emission control channel 131f A driving source electrode 136a and a driving drain electrode 137a are formed on respective sides of the driving channel 131a in the semiconductor 130, and a switching source electrode 136b and a switching drain electrode 137b are formed on respective sides of the switching channel 131b. In addition, a first compensation source electrode 136c1 and a first compensation drain electrode 137c1 are formed on respective sides of a first compensation channel 131c1, a second compensation source electrode 136c2 and a second compensation drain electrode 137c2 are formed on respective sides of a second compensation channel 131c2, a first initialization source electrode 136d1 and a first initialization drain electrode 137d1 are formed on respective sides of a first initialization channel 131d1, and a second initialization source electrode 136d2 and a second initialization drain electrode 137d2 are formed on respective sides of a second initialization channel 131d2. Further, an operation control source electrode 136e and an operation control drain electrode 137e are formed on respective sides of the operation control channel 131e, and a light emission control source electrode 136f and a light emission control drain electrode 137f are formed on respective sides of the light emission control channel 131f. Also, a bypass source electrode 136g and a bypass drain electrode 137g are formed on respective sides of the bypass channel 131g.

A first insulating layer 140 covering the semiconductor 130 is formed on the semiconductor 130. On the first insulating layer 140, a gate wire (121, 122, 123, 155a, 155b, 155c1, 155c2, 155d1, 155d2, 155e, 155f, and 172b) including a scan line 121 including a switching gate electrode 155b, a first compensation gate electrode 155c1, a second compensation gate electrode 155c2, a previous scan line 122 including a first initialization gate electrode 155d1 and a second initialization gate electrode 155d2, a light emission control line 123 including an operation control gate electrode 155e and a light emission control gate electrode 155f, a driving gate electrode (first storage electrode) 155a, and a second driving voltage line 172b is formed.

A second insulating layer 160 covering the gate wire (121, 122, 123, 155a, 155b, 155c1, 155c2, 155d1, 155d2, 155e, 155f, and 172b) and the first insulating layer 140 is formed thereon. The first insulating layer 140 and the second insulating layer 160 are formed of a silicon nitride (SiNx) or a silicon oxide (SiOx).

On the second insulating layer 160, a data wire (171, 172a, 174, 175, 178, and 179) including a data line 171, a first driving voltage line 172a including a second storage electrode 178, a first data connecting member 174, a second data connecting member 175, and a third data connecting member 179 is formed.

As described above, the second storage electrode 178 is formed of the same material and the same layer as the first driving voltage line 172a and the data line 171 such that it is not required to form the second storage electrode as a separate layer, thereby reducing the number of masks used in the manufacturing process.

The first driving voltage line 172a overlaps the driving source electrode 136a to form the assistance capacitor Cse. Also, the parasitic capacitor Cgs is formed between the driving gate electrode 155a and the driving source electrode 136a. As described above, by controlling the overlapping area of the driving source electrode 136a and the first driving voltage line 172a, the capacitance of the assistance capacitor Cse may be controlled to be larger than the capacitance of the parasitic capacitor Cgs.

The data line 171 is connected to the switching source electrode 136b through a contact hole 62 formed in the first insulating layer 140 and the second insulating layer 160, one end of the first data connecting member 174 is connected to the first storage electrode 155a through a contact hole 61 formed in the first insulating layer 140 and the second insulating layer 160, and the other end of the first data connecting member 174 is connected to the second compensation drain electrode 137c2 and the second initialization drain electrode 137d2 through a contact hole 63 formed in the first insulating layer 140 and the second insulating layer 160.

The second data connecting member 175 is connected to the first initialization source electrode 136d1 through a contact hole 64 formed in the first insulating layer 140 and the second insulating layer 160, and is connected to the bypass drain electrode 137g through a contact hole 67 formed in the first insulating layer 140 and the second insulating layer 160. By indirectly connecting the bypass drain electrode 137g and the first initialization source electrode 136d1 through the second data connecting member 175 without the direct connection, the transistor may be prevented from being formed near the second driving voltage line 172b.

Further, the quadrangular-shaped third data connecting member 179 is connected to the light emission control drain electrode 137f through the contact hole 66 formed at the first insulating layer 140 and the second insulating layer 160.

A passivation layer 180 covering the data wire (171, 172a, 174, 175, 178, and 179) and the second insulating layer 160 is formed thereon. The passivation layer 180 may be formed of an inorganic film. The pixel electrode 191 and the initialization line 192 are disposed on the passivation layer 180. The third data connecting member 179 is connected to the pixel electrode 191 through a contact hole 81 formed at the passivation layer 180, and the second data connecting member 175 is connected to the initialization line 192 through the contact hole 82 formed at the passivation layer 180.

A pixel definition layer (PDL) 350 covering the passivation layer 180, the initialization voltage line 192, and the pixel electrode 191 is formed on edges of the passivation layer 180, the initialization voltage line 192, and the pixel electrode 191, and the pixel definition layer 350 has a pixel opening 351 that exposes the pixel electrode 191. The pixel definition layer 350 may be made of a polyacrylate resin, a polyimide resin, or a silica-based inorganic material.

The organic emission layer 370 is disposed on the pixel electrode 191 exposed by the pixel opening 351, and the common electrode 270 is formed on the organic emission layer 370. Accordingly, the OLED including the pixel electrode 191, the organic emission layer 370, and the common electrode 270 is formed.

Herein, the pixel electrode 191 serves as an anode which is a hole injection electrode, and the common electrode 270 serves as a cathode which is an electron injection electrode. However, the present exemplary embodiment is not limited thereto. Alternatively, according to the driving method of the OLED display, the pixel electrode 191 may serve as the cathode and the common electrode 270 may serve as the anode. When holes and electrons are injected into the organic emission layer 370 from the pixel electrode 191 and the common electrode 270, respectively, and excitons acquired by combining the injected holes and electrons fall from an excitation state to a ground state, light is emitted.

The organic emission layer 370 is made of a low-molecular organic material or a high-molecular organic material such as poly(3,4-ethylenedioxythiophene) (PEDOT). Further, the organic emission layer 370 may be formed by multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer is disposed on the pixel electrode 191 which is the positive electrode, and the hole transporting layer, the emission layer, the electron transporting layer, and the electron injection layer are sequentially stacked thereon.

The organic emission layer 370 may include a red organic emission layer emitting red light, a green organic emission layer emitting green light, and a blue organic emission layer emitting blue light, and the red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are stacked together on the red pixel, the green pixel, and the blue pixel, and a red color filter, a green color filter, and a blue color filter are formed for each pixel to implement the color images. As another example, a white organic emission layer emitting white light is formed on all of the red pixel, the green pixel, and the blue pixel, and the red color filter, the green color filter, and the blue color filter are formed for each pixel to implement the color images. When the color images are implemented by using the white organic emission layer and the color filters, a deposition mask for depositing the red organic emission layer, the green organic emission layer, and the blue organic emission layer on individual pixels, that is, the red pixel, the green pixel, and the blue pixel, respectively, may not be used.

The white organic emission layer described in another example may be formed by one organic emission layer and may include a configuration that may emit white light by laminating a plurality of organic emission layers. As an example, the white organic emission layer may include a configuration that enables the white light to be emitted by combining at least one yellow organic emission layer and at least one blue organic emission layer, combining at least one cyan organic emission layer and at least one red organic emission layer, combining at least one magenta organic emission layer and at least one green organic emission layer, and the like.

A sealing member (not shown) protecting the OLED may be disposed on the common electrode 270, and may be sealed on the substrate 110 by using a sealant and may be made of various materials such as glass, crystal, ceramic, plastic, and metal. Alternatively, instead of using the sealant, a thin film sealing layer may be formed by depositing an inorganic film and an organic film on the common electrode 270.

Next, a principle of reducing a voltage change of the source electrode of the driving transistor will be described with reference to FIG. 8 in the OLED display according to an exemplary embodiment.

Figure 8:
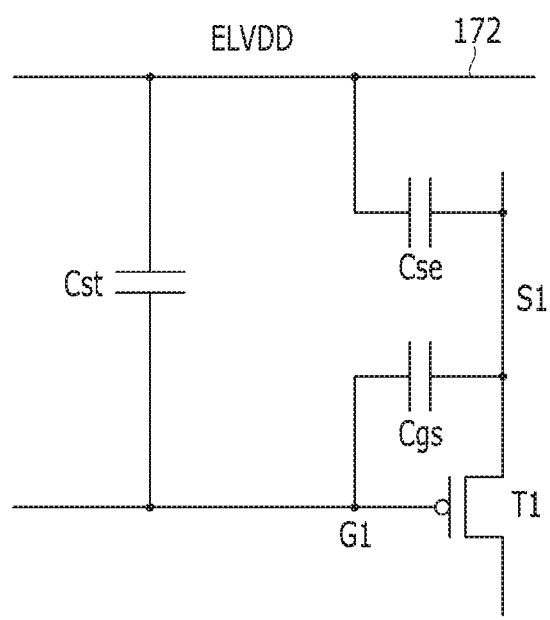
FIG. 8 is a partial equivalent circuit diagram of one pixel of an OLED display according to an exemplary embodiment.

FIG. 8 is a partial equivalent circuit diagram of one pixel of an OLED display according to an exemplary embodiment. FIG. 8 shows an equivalent circuit near the driving transistor.

The assistance capacitor Cse is formed between the source electrode S1 of the driving transistor T1 and the driving voltage line 172, and the parasitic capacitor Cgs is formed between the source electrode S1 of the driving transistor T1 and the gate electrode G1.

In the initialization step initializing the gate voltage of the gate electrode G1 of the driving transistor T1, the voltage change of the gate electrode G1 is generated. In this case, the voltage of the source electrode S1 of the driving transistor T1 may also be changed due to the parasitic capacitor Cgs. In an exemplary embodiment, the assistance capacitor Cse is formed between the source electrode S1 of the driving transistor T1 and the driving voltage line 172 applied with a DC power source, thereby preventing the voltage of the source electrode S1 of the driving transistor T1 from being changed. In this case, the capacitance of the assistance capacitor Cse is formed to be larger than the capacitance of the parasitic capacitor Cgs, thereby effectively preventing the voltage change of the source electrode S1 of the driving transistor T1.

Next, the OLED display according to an exemplary embodiment will be described with reference to FIG. 9 to FIG. 11.

Figure 9:
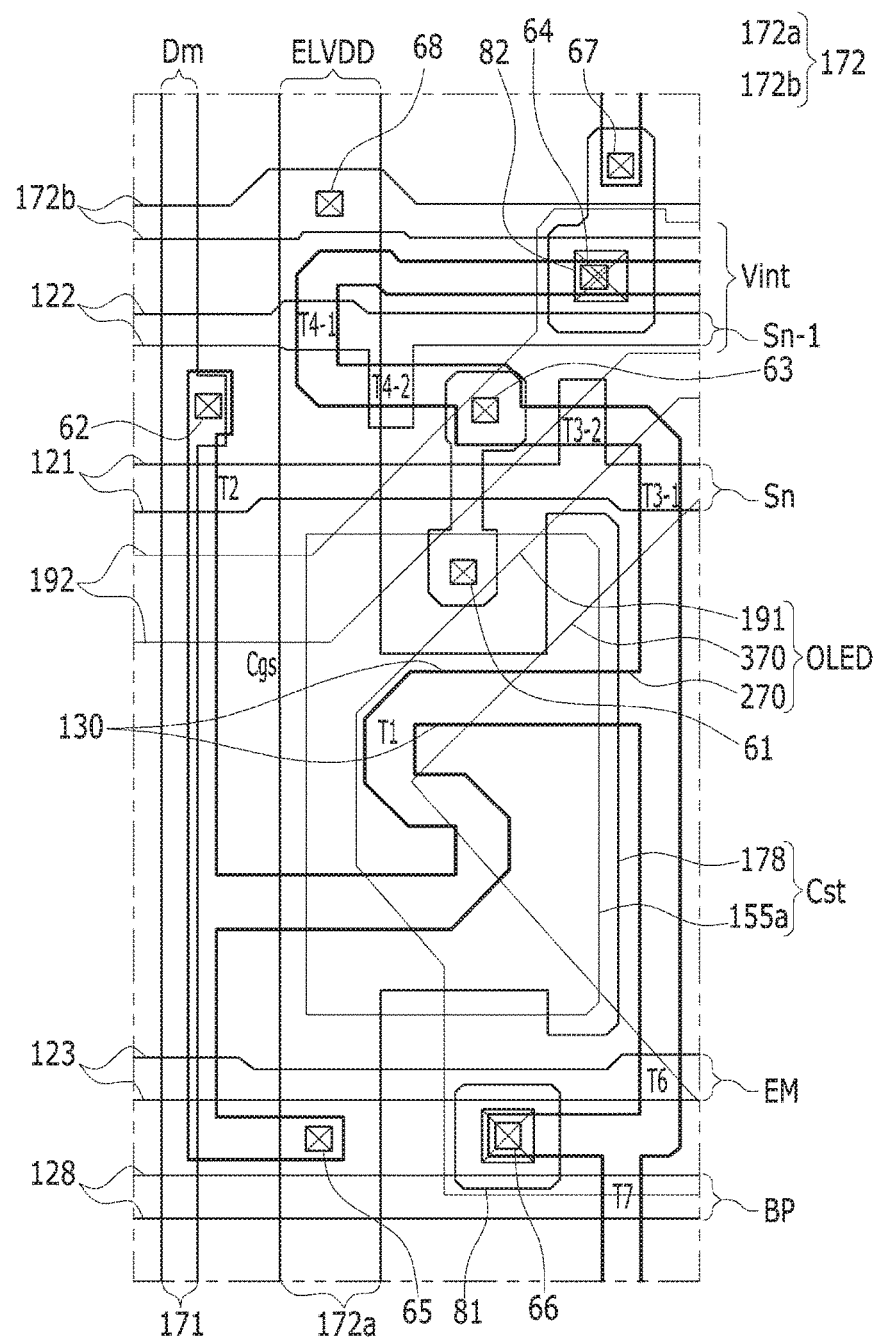
FIG. 9 is a diagram schematically illustrating a plurality of transistors and capacitors of an OLED display according to the exemplary embodiment.
Figure 10:
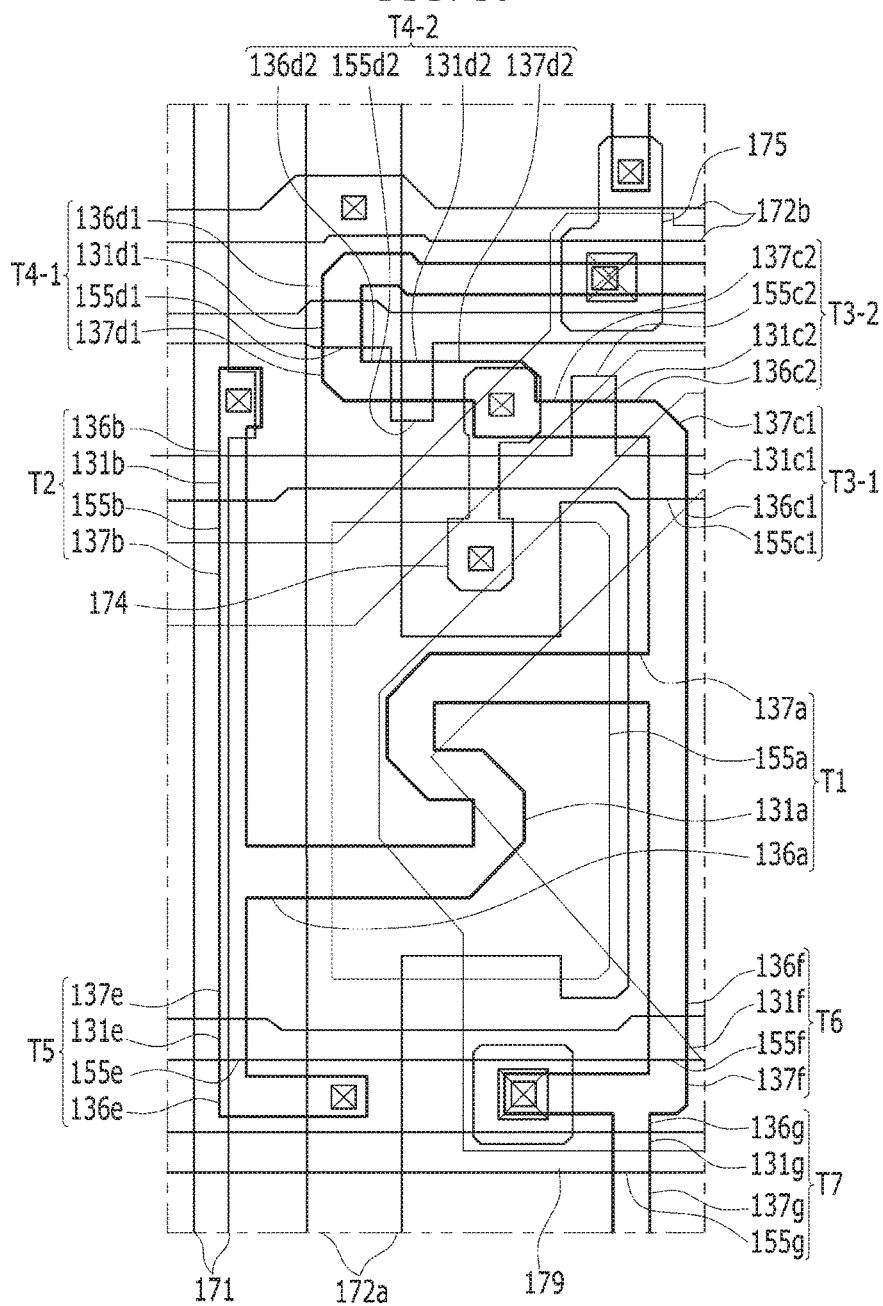
FIG. 10 is a detailed layout view of FIG. 9.
Figure 11:
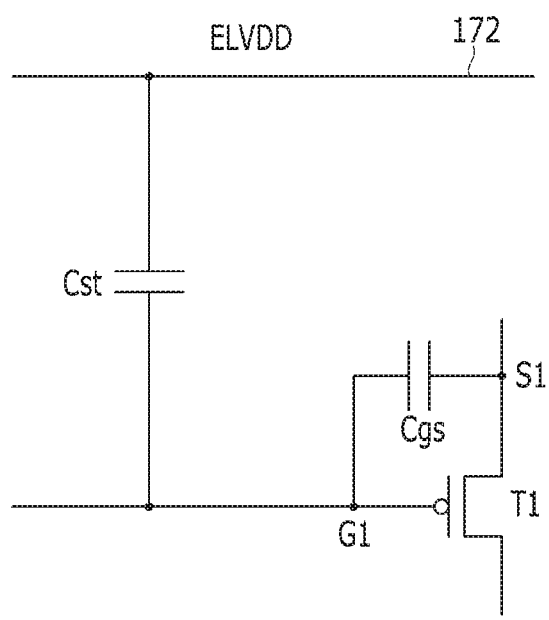
FIG. 11 is a partial equivalent circuit diagram of one pixel of an OLED display according to an exemplary embodiment.

The OLED display according to an exemplary embodiment shown in FIG. 9 to FIG. 11 is mostly the same as the display device according to an exemplary embodiment shown in FIG. 1 to FIG. 8 such that the description thereof is omitted. The present exemplary embodiment is different from the previous exemplary embodiment in a point that the driving source electrode and the driving voltage line do not substantially overlap, and this will be described.

FIG. 9 is a diagram schematically illustrating a plurality of transistors and capacitors of an OLED display according to the exemplary embodiment, and FIG. 10 is a detailed layout view of FIG. 9.

In the present exemplary embodiment, differently from the previous exemplary embodiment, the driving source electrode 136a does not substantially overlap the driving voltage line 172. The driving source electrode 136a is made with the same width as the switching source electrode 136b. Also, the first driving voltage line 172a is made with a constant width.

By forming the driving source electrode 136a to overlap the portion of the data line 171, the distance between the driving source electrode 136a and the driving gate electrode 155a may be increased. Also, by reducing the size of the driving gate electrode 155a, the distance between the driving source electrode 136a and the driving gate electrode 155a may be increased. Accordingly, the capacitance of the parasitic capacitor Cgs between the driving source electrode 136a and the driving gate electrode 155a may be reduced.

Next, the principle of reducing the voltage change of the source electrode of the driving transistor will be described with reference to FIG. 11 in the OLED display according to an exemplary embodiment.

FIG. 11 is a partial equivalent circuit diagram of one pixel of an OLED display according to an exemplary embodiment. FIG. 11 shows the equivalent circuit around the driving transistor.

The parasitic capacitor Cgs is formed between the source electrode S1 of the driving transistor T1 and the gate electrode G1.

In the initialization step of initializing the gate voltage of the gate electrode G1 of the driving transistor T1, the voltage change of the gate electrode G1 is generated. In this case, the voltage of the source electrode S1 of the driving transistor T1 may also be changed by the parasitic capacitor Cgs. The capacitance of the parasitic capacitor Cgs may be changed depending on the distance between the source electrode S1 and the gate electrode G1. In the present exemplary embodiment, by increasing the distance between the source electrode S1 and the gate electrode G1 to minimize the capacitance of the parasitic capacitor Cgs, the voltage of the source electrode S1 of the driving transistor T1 may be prevented from being changed.

Next, the OLED display according to an exemplary embodiment will be described with reference to FIG. 12 to FIG. 14.

Figure 12:
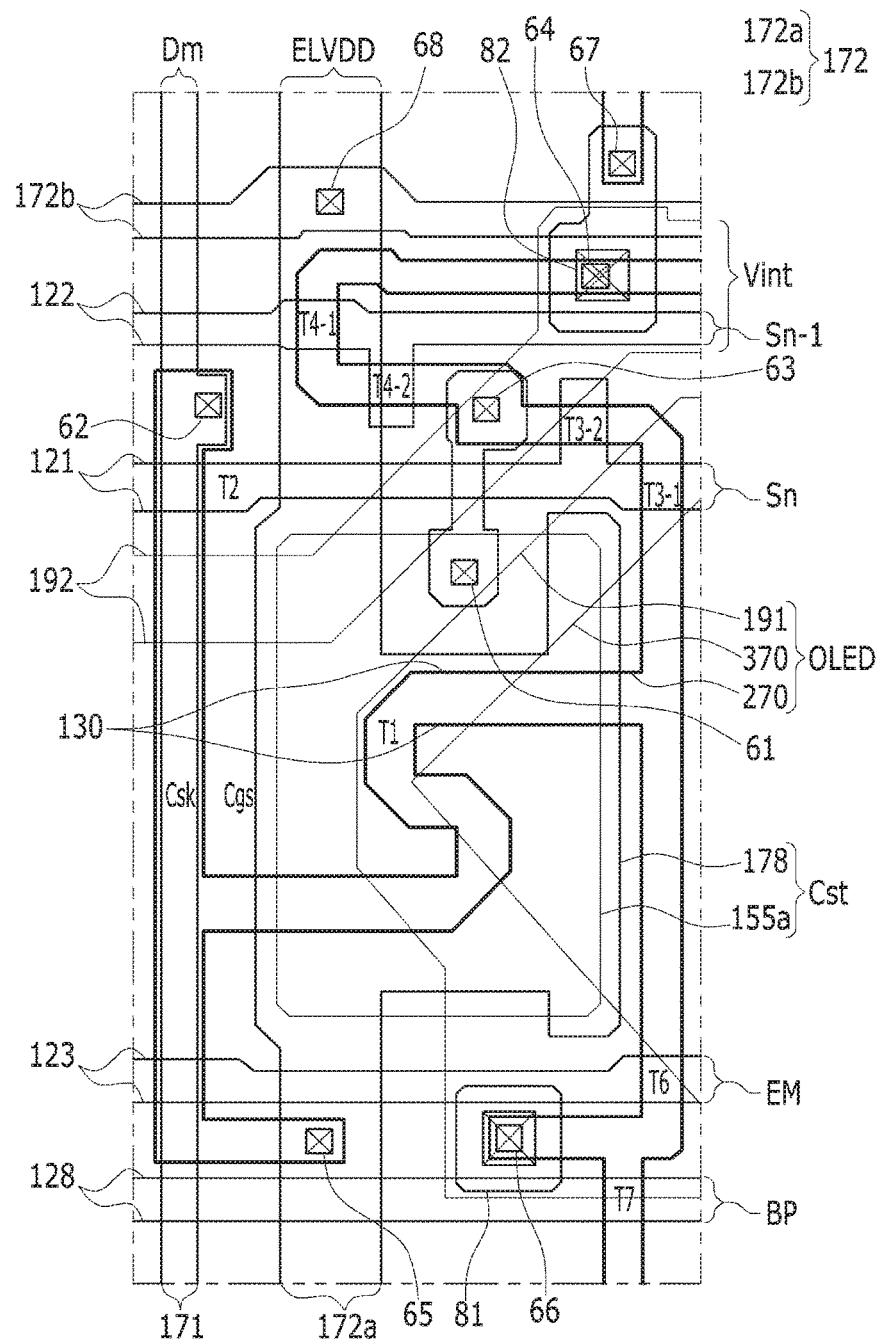
FIG. 12 is a diagram schematically illustrating a plurality of transistors and capacitors of an OLED display according to the exemplary embodiment.
Figure 13:
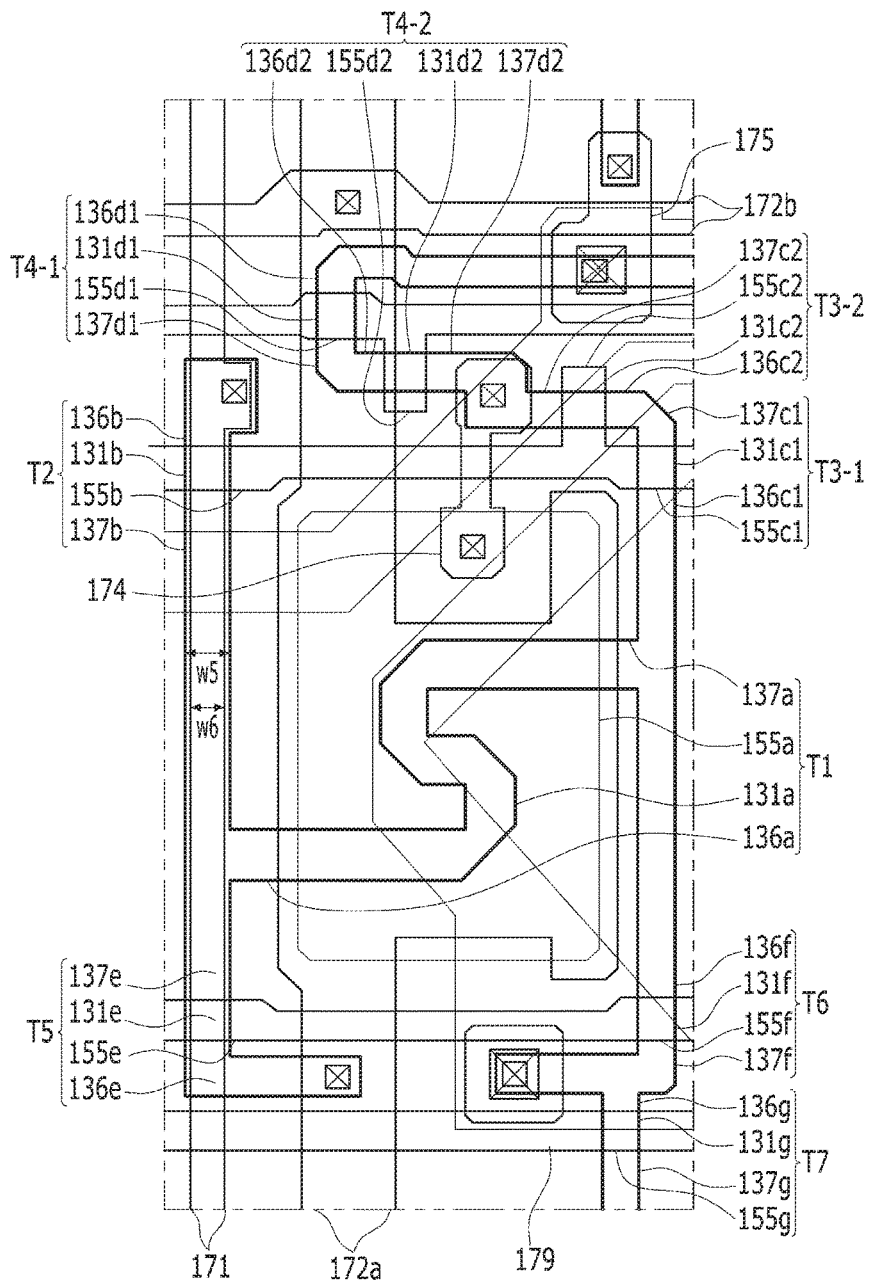
FIG. 13 is a detailed layout view of FIG. 12.
Figure 14:
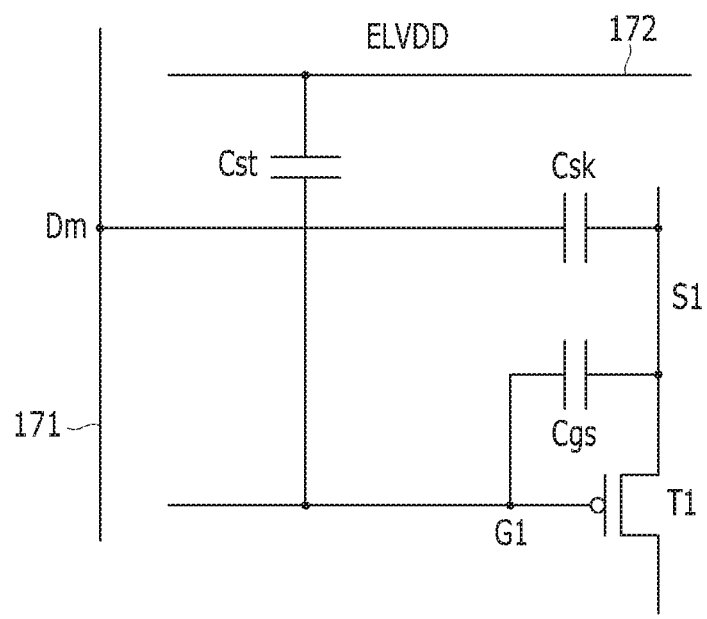
FIG. 14 is a partial equivalent circuit diagram of one pixel of an OLED display according to an exemplary embodiment.

The OLED display according to an exemplary embodiment shown in FIG. 12 to FIG. 14 is mostly the same as the display device according to an exemplary embodiment shown in FIG. 1 to FIG. 8 such that the description thereof is omitted. The present exemplary embodiment is different from the previous exemplary embodiment in a point that the driving source electrode and the data line overlap each other.

FIG. 12 is a diagram schematically illustrating a plurality of transistors and capacitors of an OLED display according to the exemplary embodiment, and FIG. 13 is a detailed layout view of FIG. 12.

In the present exemplary embodiment, the driving source electrode 136a overlaps the data line 171 to form the assistance capacitor Csk. That is, one terminal of the assistance capacitor Csk is the driving source electrode 136a, and the other terminal of the assistance capacitor Csk is the data line 171. In this case, the capacitance of the assistance capacitor Csk is determined by the overlapping area of the driving source electrode 136a and the data line 171.

The width w5 of the driving source electrode 136a is larger than the width w6 of the data line 171. The driving source electrode 136a is formed to cover the entire data line 171 in the overlapping portion with the data line 171. In this case, by increasing the overlapping area of the driving source electrode 136a and the data line 171, the capacitance of the assistance capacitor Csk may be increased. In the present exemplary embodiment, by controlling the overlapping area of the driving source electrode 136a and the data line 171, the capacitance of the assistance capacitor Csk may be larger than the capacitance of the parasitic capacitor Cgs.

Next, the principle of reducing the voltage change of the source electrode of the driving transistor will be described with reference to FIG. 14 in the OLED display according to an exemplary embodiment.

FIG. 14 is a partial equivalent circuit diagram of one pixel of an OLED display according to an exemplary embodiment. FIG. 14 shows the equivalent circuit around the driving transistor.

The assistance capacitor Csk is formed between the source electrode S1 of the driving transistor T1 and the data line 171, and the parasitic capacitor Cgs is formed between the source electrode S1 of the driving transistor T1 and the gate electrode G1.

In the initialization step of initializing the gate voltage of the gate electrode G1 of the driving transistor T1, the voltage change of the gate electrode G1 is generated. In this case, the voltage of the source electrode S1 of the driving transistor T1 may be changed together due to the parasitic capacitor Cgs. In an exemplary embodiment, the assistance capacitor Csk is formed between the source electrode S1 of the driving transistor T1 and the data line 171 applied with the DC power source, thereby preventing the voltage of the source electrode S1 of the driving transistor T1 from being changed. In this case, the capacitance of the assistance capacitor Csk is formed to be larger than the capacitance of the parasitic capacitor Cgs, thereby effectively preventing the voltage change of the source electrode S1 of the driving transistor T1.

While the inventive technology has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate;
   a scan line disposed over the substrate and configured to transmit a scan signal;
   a data line crossing the scan line and configured to transmit a data voltage;
   a driving voltage line crossing the scan line and configured to transmit a driving voltage;
   a switching transistor connected to the scan line and the data line;
   a driving transistor connected to the switching transistor and including a driving gate electrode, a driving source electrode, and a driving drain electrode; and
   an OLED electrically connected to the driving transistor,
   wherein the driving source electrode at least partially overlaps the data line in a depth dimension of the OLED display so as to form an assistance capacitor.

2. The OLED display of claim 1, further comprising a parasitic capacitor formed between the driving gate electrode and the driving source electrode, wherein the assistance capacitor has a capacitance that is larger than that of the parasitic capacitor.

3. The OLED display of claim 1, wherein the driving source electrode has a width that is larger than that of the data line in a plan view.

4. The OLED display of claim 1, wherein the OLED includes:
   a pixel electrode electrically connected to the driving transistor;
   an organic emission layer disposed on the pixel electrode; and
   a common electrode disposed on the organic emission layer, and
   wherein the OLED display further comprises an initialization voltage line formed on the same layer as the pixel electrode and configured to transmit an initialization voltage initializing the driving transistor.

5. The OLED display of claim 1, wherein the data line includes a first portion that overlaps the driving source electrode and a second portion that does not overlap the driving source electrode, and wherein the width of the first portion is larger than the width of the second portion in a plan view.

6. The OLED display of claim 1, wherein a portion of the driving source electrode overlaps the driving voltage line in the depth dimension of the OLED display.

7. The OLED display of claim 1, wherein the data line includes a first portion that overlaps a first portion of the driving source electrode and a second portion that does not overlap the driving source electrode, and wherein the first portion of the data line has a width that is narrower than that of the first portion of the driving source electrode.

8. The OLED display of claim 7, wherein the first portion of data line is within the first portion of the driving source electrode in a plan view.

9. The OLED display of claim 1, wherein the switching transistor includes a switching gate electrode, a switching source electrode, and a switching drain electrode, and wherein the switching drain electrode at least partially overlaps the data line in a depth dimension of the OLED display.

10. The OLED display of claim 9, wherein the switching drain electrode has a width that is larger than that of the data line in a plan view.

11. The OLED display of claim 9, wherein the switching transistor further includes a switching channel between the switching gate electrode and the switching source electrode, and wherein the switching gate electrode, the switching channel, and the switching source electrode extend in a direction parallel to the data line.

12. A display, comprising:
   a scan line configured to transmit a scan signal;
   a data line configured to transmit a data voltage;
   a driving voltage line configured to transmit a driving voltage;
   a switching transistor connected to the scan line and the data line;
   a driving transistor connected to the switching transistor and including a driving gate electrode, a driving source electrode, and a driving drain electrode; and
   a light-emitting diode electrically connected to the driving transistor,
   wherein the driving source electrode includes a portion that overlaps with the data line in a plan view so as to form an assistance capacitor.

13. The display of claim 12, further comprising a parasitic capacitor formed between the driving gate electrode and the driving source electrode, wherein the assistance capacitor has a capacitance that is larger than that of the parasitic capacitor.

14. The display of claim 12, wherein the driving source electrode has a width that is larger than that of the data line in a plan view.

15. The display of claim 12, wherein the data line includes a first portion that overlaps with the portion of the driving source electrode and a second portion that does not overlap the driving source electrode, and wherein the first portion of data line is within the portion of the driving source electrode in the plan view.

* * * * *